(12) United States Patent
Mouli

(10) Patent No.: US 7,223,960 B2
(45) Date of Patent: May 29, 2007

(54) IMAGE SENSOR, AN IMAGE SENSOR PIXEL, AND METHODS OF FORMING THE SAME

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 10/725,494

(22) Filed: Dec. 3, 2003

(65) Prior Publication Data
US 2005/0121599 A1 Jun. 9, 2005

(51) Int. Cl.
*G01J 3/50* (2006.01)
*H01J 40/14* (2006.01)
*H01J 5/16* (2006.01)
*H01L 31/00* (2006.01)
*H01L 27/00* (2006.01)

(52) U.S. Cl. .............. 250/226; 250/208.1; 250/214.1

(58) Field of Classification Search ......... 250/208.1, 250/214.1, 226; 257/98, 291, 294, 431–432; 348/266
See application file for complete search history.

(56) References Cited

U.S. PATENT DOCUMENTS

| | | | | |
|---|---|---|---|---|
| 4,158,133 A | * | 6/1979 | Spaeth et al. | 250/214 R |
| 4,547,074 A | * | 10/1985 | Hinoda et al. | 356/405 |
| 5,973,316 A | * | 10/1999 | Ebbesen et al. | 250/216 |
| 6,285,020 B1 | * | 9/2001 | Kim et al. | 250/216 |
| 6,637,955 B2 | * | 10/2003 | Toyoda | 396/484 |
| 2003/0103150 A1 | | 6/2003 | Catrysse et al. | |

FOREIGN PATENT DOCUMENTS

| JP | 62278432 A | * | 12/1987 |
|---|---|---|---|
| WO | WO 2004/054001 A | | 6/2004 |
| WO | WO 2004/054001 A2 | | 6/2004 |

OTHER PUBLICATIONS

Schmidt, D.J., et al., "Color Filtering Metallization For Optoelectronic 100nm CMOS Circuits", International Electron Devices Meeting 2003, IEDM, Technical Digest, Washington, DC, Dec. 8-10, 2003, New York, NY: IEEE, US, Dec. 8, 2003, pp. 389-392.
Ebbesen, T.W., et al., "Extraordinary Optical Transmission Through Sub-wavelengths Hole Arrays", Nature, MacMillan Journals Ltd., London, GB, vol. 391, No. 6668, Feb. 12, 1998, pp. 667-669.
Schmidt et al., "Color Filtering metallization for Optoelectronic 100nm CMOS Circuits", International Electron Devices Meeting 2003. IEDM. Technical Digest, Washington, DC, Dec. 8-10, 2003, New York, NY IEEE, Dec. 8, 2003, pp. 389-392.

* cited by examiner

*Primary Examiner*—Georgia Epps
*Assistant Examiner*—Patrick J. Lee
(74) *Attorney, Agent, or Firm*—Dickstein Shapiro LLP

(57) ABSTRACT

A semiconductor image sensor utilizing a metal mesh filter to transmit light of a specific wavelength to a photoconversion device, and method of making said image sensor. Semiconductor image sensor pixel cells using varied metal mesh filters may be arranged in a Bayer pattern for color imaging. As a result, the need for using conventional polymer color filters in image sensor applications is eliminated.

93 Claims, 20 Drawing Sheets

IMAGE SENSOR, AN IMAGE SENSOR PIXEL, AND METHODS OF FORMING THE SAME

BACKGROUND OF THE INVENTION

1. Field of the Invention

The present invention relates generally to semiconductor imagers employing color filters.

2. Description of the Related Art

Known semiconductor image sensors include a focal plane array of pixel cells, each one of the cells including a photoconversion device, for example, a photogate, photoconductor, or a photodiode for accumulating photo-generated charge in a portion of the substrate. Regardless of the type of imager, the photo-generated charges accumulated in the photoconversion devices from each pixel are transferred to additional circuitry to form an electrical output image. Known semiconductor imagers include complementary metal-oxide semiconductor (CMOS) imagers and charge-coupled device (CCD) imagers. In CCD imagers, the accumulated charges of multiple pixels in the pixel array are read sequentially through an output amplifier. In CMOS imagers, the accumulated charge of each pixel is read individually using multiple transistors dedicated to each pixel. Although it will become clear that the present invention is not limited to any particular type of semiconductor imager, in order to provide some context for the invention, an exemplary CMOS image sensor is now described with reference to FIG. 1.

The illustrated imager shown in FIG. 1 includes a conventional pixel cell 100. Pixel cell 100 typically includes a photodiode 4 having a p-region 8 and an n-region 6 in a p-substrate 2. The pixel 100 also includes a transfer transistor with associated gate 20, a floating diffusion region 16 formed in a more heavily doped p-type well 12, and a reset transistor with associated gate 18. Photons striking the surface of the p-region 8 of the photodiode 4 generate electrons that are collected in the n-region 6. From n-region 6, the accumulated charge is read out through circuitry comprising plugs 24 and conductive features 26 formed in successive transparent insulating layers 28 according to the desired characteristics of pixel cell 100. Pixel cell 100 further comprises trench isolation regions 10 formed in p-substrate 2 used to isolate adjacent pixel cells. A color filter 30 is typically formed on top of CMOS pixel 100 and substantially over photodiode 4. A microlens 32 may be provided over color filter 30 to direct incident light towards photodiode 4.

A color filter 30 is typically a polymer-based film sensitive to different wavelengths in the visible spectrum. Each pixel of a CMOS imager is covered with a color filter, typically a red, blue, or green filter. These color filters together comprise a color filter array ("CFA") arranged in a specific pattern. This pattern, or sequence, of filters can vary, but the "Bayer" CFA pattern, has been widely adopted. A typical red-blue-green Bayer CFA pattern consists of rows of alternating red and green color filters and alternating blue and green color filters as shown in FIG. 2a. Each color filter 30 in Bayer CFA 50 corresponds to one pixel in an underlying CMOS imager. FIG. 2b shows another common Bayer CFA that uses cyan, yellow, and magenta color filters 30.

Using color filters in semiconductor imager applications presents several undesirable constraints for high volume manufacturing. Examples of these constraints are the difficulty in achieving uniform chemical properties in the polymer color filters, uniform filter thickness, stability of the color filters in the semiconductor imager and uniform positioning of color filters in a semiconductor imager, e.g., uniform proximity to the photodiode. Conventional polymer color filters also complicate the manufacturing process because they are separate components that must be integrated into the semiconductor imager product.

There is, therefore, a need for a semiconductor imager that does not utilize conventional polymer color filters and as a result does not suffer the shortcomings associated with these color filters. A method of fabricating such a semiconductor imager is also needed.

SUMMARY

Various embodiments of the present invention provide an imager for use in color applications that uses metal mesh filters instead of polymer color filters. A metal mesh filter includes a collection of apertures through which electromagnetic radiation may pass according to the size of the apertures. Metal mesh filters, therefore, may be designed to filter electromagnetic radiation according to wavelength. These metal mesh filters may be formed during fabrication of existing metal layers of the imager, or may be formed in separate layers.

These and other features of the invention will be more apparent from the following detailed description that is provided in connection with the accompanying drawings and illustrated exemplary embodiments of the invention.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in or over the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion. The following detailed description is, therefore, not to be taken in a limiting sense, and the scope of the present invention is defined by the appended claims.

It should be understood that reference to a CMOS imager in accordance with the present invention is made for the sole purpose of describing just one example of the present invention. It should be readily apparent that the present invention is not limited to CMOS imagers, but also applies to CCD and other imagers that include color filters.

Figure 3:
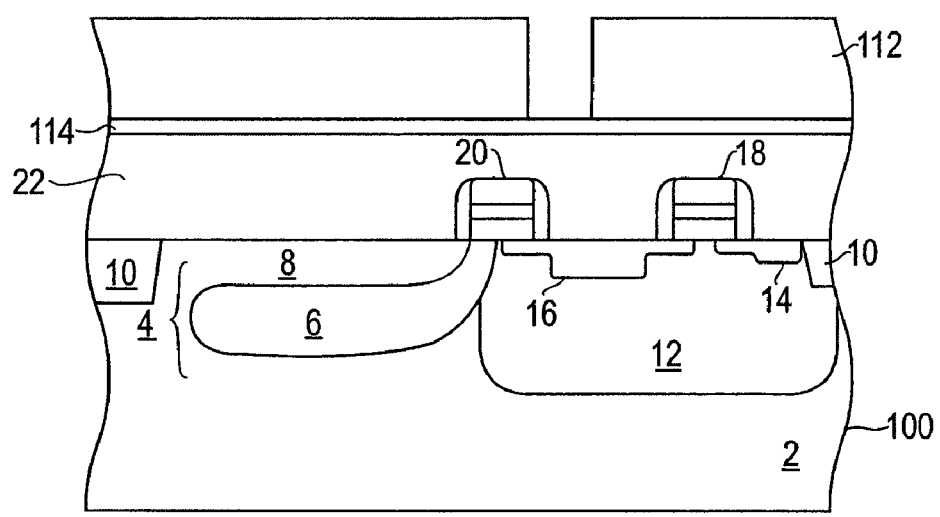
FIG. 3 shows a pixel cell of an exemplary CMOS imager in a first state of manufacture.

Referring now to the drawings, where like elements are designated by like reference numerals, FIG. 3 shows a CMOS pixel 100 which serves as the basis for the manufacturing of metal mesh filters of one embodiment of the present invention (described below). FIG. 3 shows photoresist 112 formed over transparent insulating layer 22 in a desired photolithographed pattern. An optional thin dielectric layer 114, which may comprise known dielectric materials such as tantalum pentoxide, hafnium oxide and zirconium, is shown deposited over transparent insulating layer 22.

Figure 4:
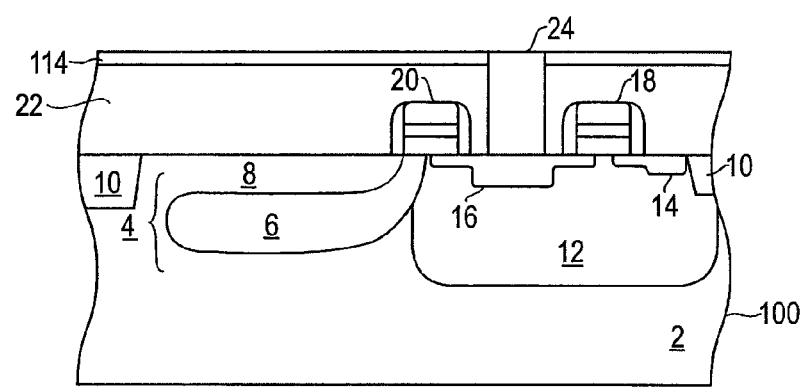
FIG. 4 shows a pixel cell of an exemplary CMOS imager in a state of manufacture subsequent to that shown in FIG. 3.

FIG. 4 shows metal plug 24 formed after photolithography and deposition of a desired metal in the resulting via. Plug 24 represents a portion of the conductive path including plugs 24 and conductive features 26 shown in FIG. 1, which provides an electrical connection between floating diffusion region 16 and subsequent circuitry. Plug 24 is formed by depositing the desired constituent metal over transparent insulating layer 22 and within the given via. Unwanted metal remaining over insulating layer 22 may be removed by any suitable method, such as chemical mechanical polishing.

Figure 5:
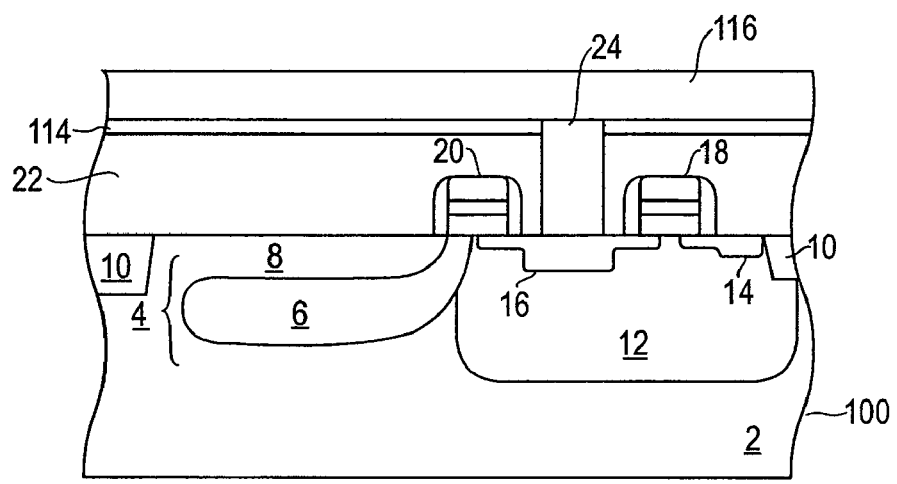
FIG. 5 shows a pixel cell of an exemplary CMOS imager in a state of manufacture subsequent to that shown in FIG. 4.
Figure 6:
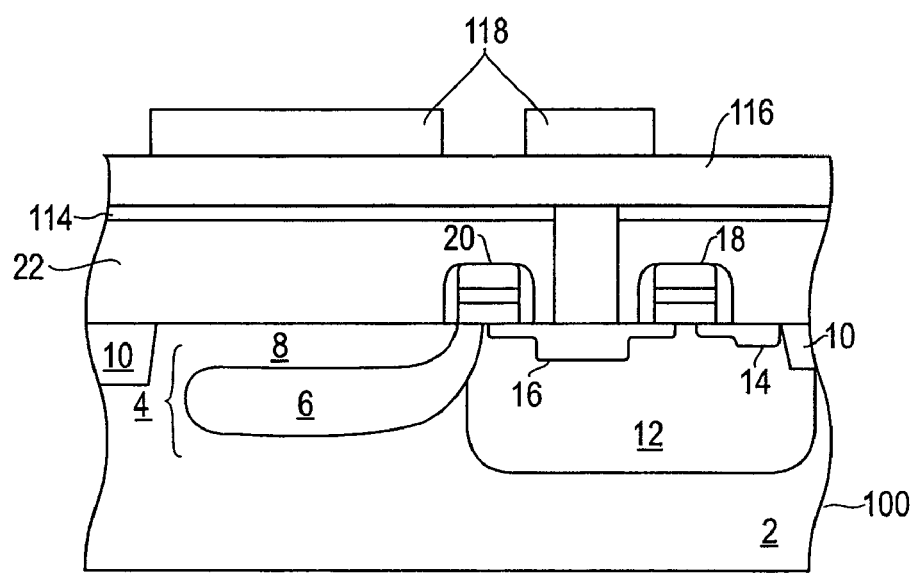
FIG. 6 shows a pixel cell of an exemplary CMOS imager in a state of manufacture subsequent to that shown in FIG. 5.
Figure 7:
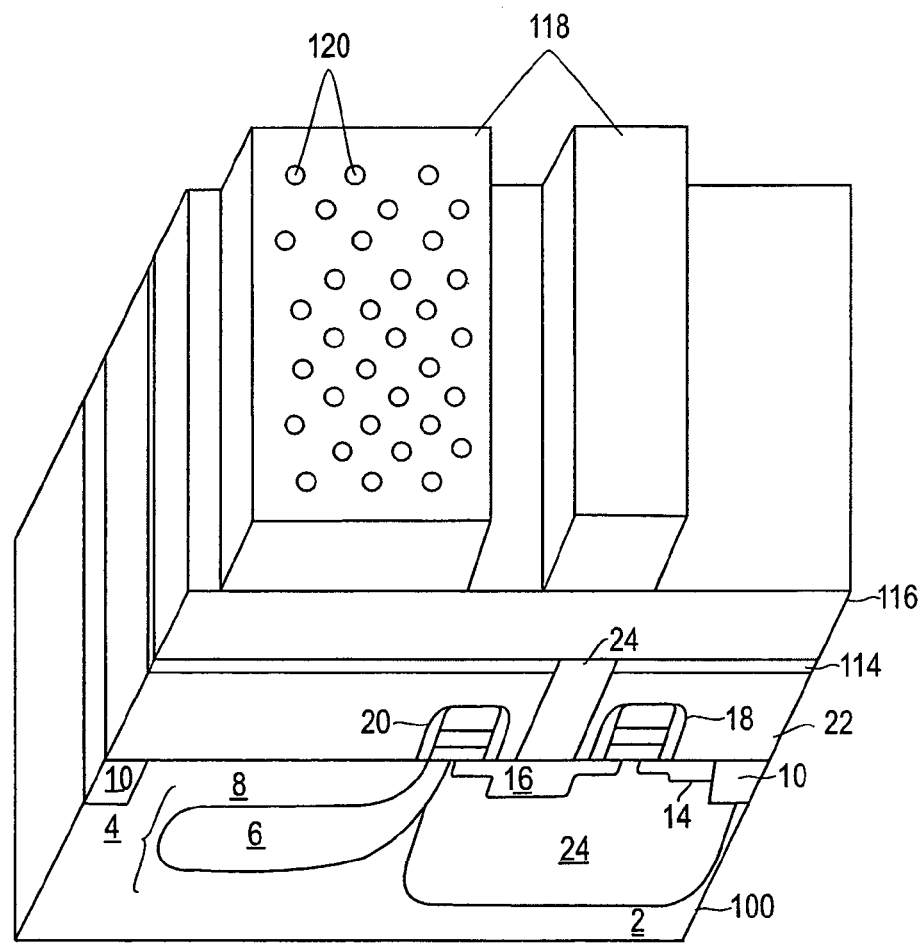
FIG. 7 shows the pixel cell of FIG. 6 from an alternate perspective.

Next, a first metal layer 116 is deposited over thin dielectric layer 114 and plug 24 (FIG. 5). It is from this metal layer 116 that further components electrically connected to plug 24 are formed. First metal layer 116 is preferably about 70 nm to about 150 nm thick and is preferably formed from aluminum, silver, copper, gold, or any other suitable metal. In a preferred embodiment, a metal mesh filter is also formed from first metal layer 116. Referring to FIG. 6, this is accomplished by forming mesh-patterned photoresist 118 over transparent insulating layer 22 and substantially over the portion of substrate 2 containing photodiode 4. FIG. 7 is a three-dimensional top-down representation of the portion of the CMOS imager shown in FIG. 6. As can be seen in FIG. 7, mesh-patterned photoresist 118 includes a plurality of apertures 120 in the area over photodiode 4.

Figure 1:
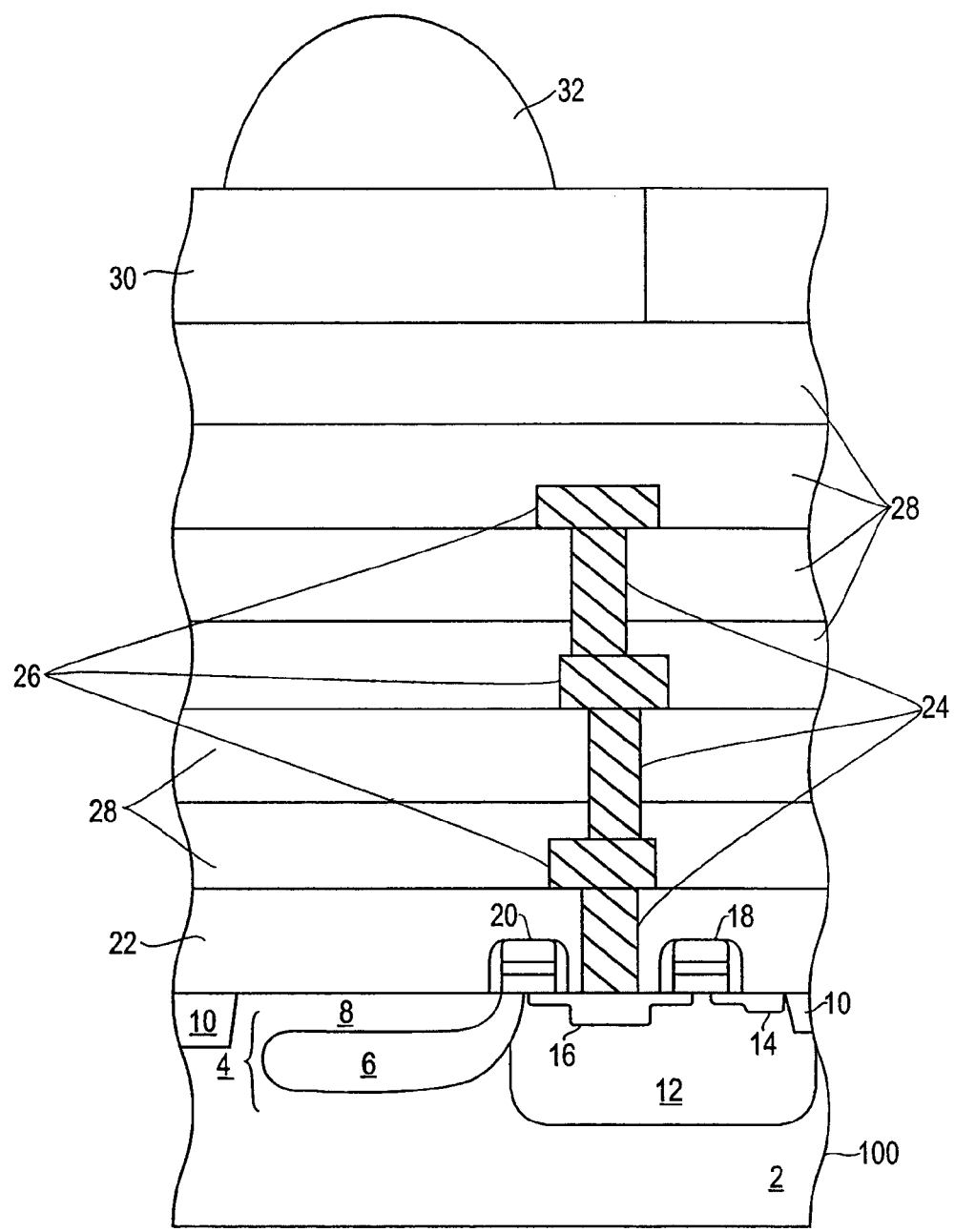
FIG. 1 shows a pixel cell of an exemplary CMOS imager in an advanced state of manufacture.
Figure 2A:
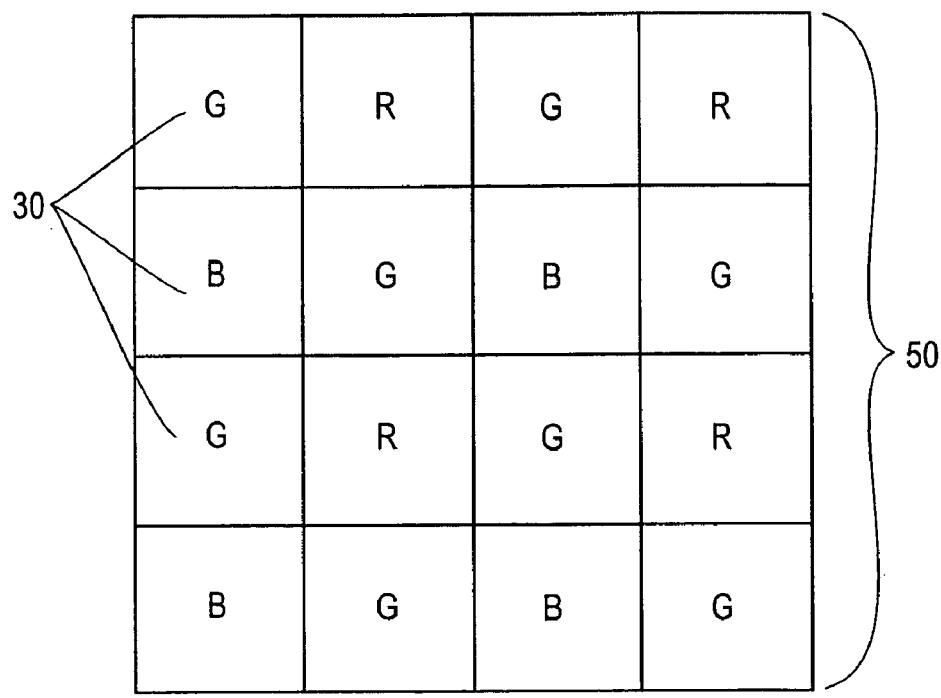
FIG. 2a shows a Bayer color filter array utilizing red, blue, and green color filters.
Figure 2B:
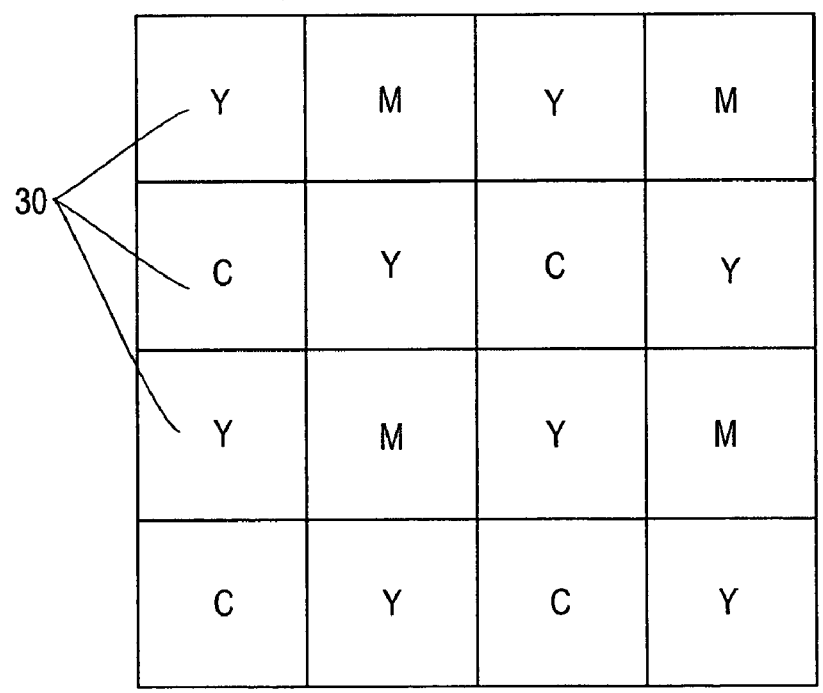
FIG. 2b shows a Bayer color filter array utilizing cyan, yellow, and magenta color filters.
Figure 8:
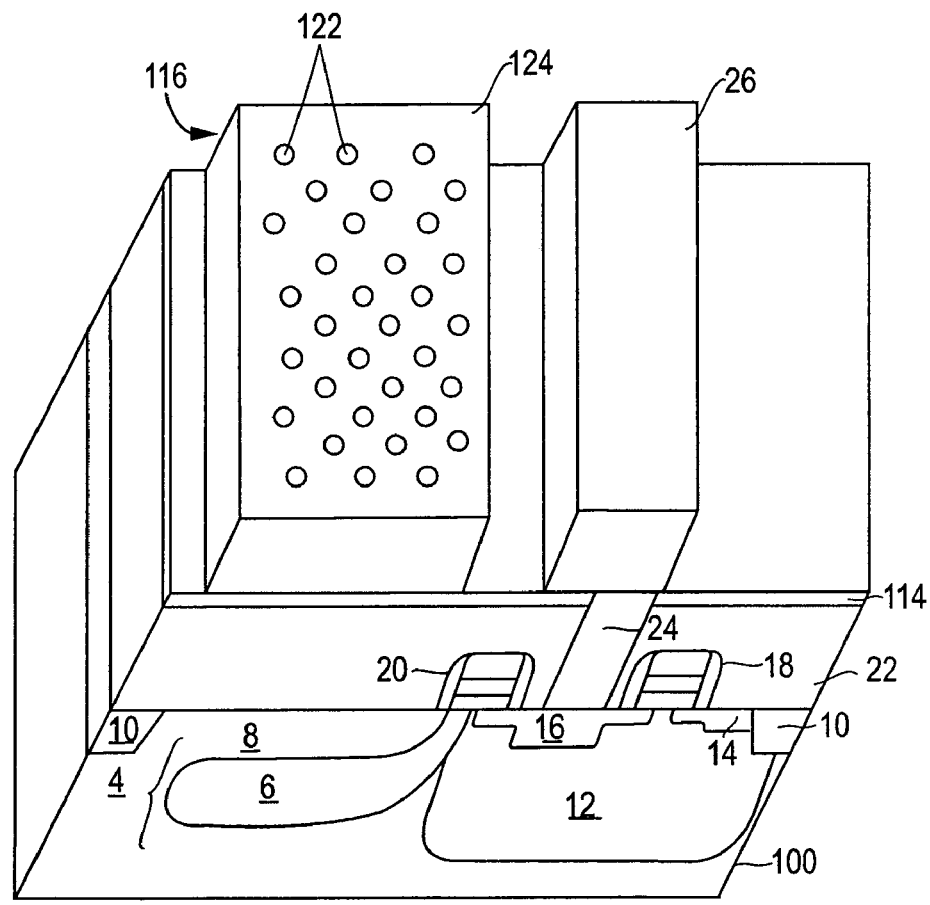
FIG. 8 shows a pixel cell of an exemplary CMOS imager in a state of manufacture subsequent to that shown in FIG. 7.

FIG. 8 is a three-dimensional representation of the CMOS pixel cell 100 shown in FIG. 7 after photolithography and removal of photoresist 118. Apertures 122 are formed in first metal layer 116 as a result of performing the photolithography step with mesh-patterned photoresist 118 (FIG. 7). The portion of first metal layer 116 that includes apertures 122 forms the metal mesh filter 124. In the illustrated embodiment, the portion of first metal layer 116 remaining over plug 24 is a conductive feature 26 (as shown in FIG. 1), which is part of pixel circuitry.

The number, size and shape of apertures 122 in metal mesh filter 124 depends on the characteristics desired for the filtered light. Preferably, apertures 122 are formed that have a top-down profile of a known geometric shape. As shown in FIG. 8, a circular aperture is included in the illustrated embodiment. Apertures 122 may also be triangular or rectangular, or any other shape suitable for the desired application. A person of ordinary skill in the art will recognize that different shapes will provide different cutoff frequencies for light filtered through metal mesh filter 124, and thus the specific characteristics of filtered light may be tuned by optimizing metal mesh filter 124 with appropriately shaped apertures 122.

Apertures of the metal mesh filters used in the present invention are preferably approximately the same size of the wavelength of the light desired to be filtered and transmitted through the filter. For example, referring to FIG. 8, if apertures 122 are intended to pass red light (and filter out other colors), they are preferably formed with a diameter approximately equal to the wavelength of red light, about 650 nm. Likewise, metal mesh filters utilizing apertures of appropriate sizes may be used to pass blue light (about 475 nm) and green light (about 525 nm).

As described in "Extraordinary optical transmission through sub-wavelength hole arrays," T. W. Ebbesen et al., 391 Nature 667 (Feb. 12, 1998), photons will be transmitted through, and not disruptively reflected by, the filters utilized in the present invention. With appropriate metal patterns, as disclosed herein, incident photons stimulate electron oscillation in the top portion of the metal mesh surface; these are referred to as "surface plasmons." Top surface plasmons couple with back surface plasmons to provide emission of photons in the back surface of the metal mesh filter. In the present invention, this results in a high transmittance of photons of the selected wavelength through the metal mesh filter and to the photodiode, particularly for visible wavelengths. Metal mesh filters that pass red, blue and green light may be applied to a CMOS imager array (with one diffraction grating over each photosensor) in the Bayer pattern as discussed above to provide color imaging.

In addition to the size of apertures 122, other factors which affect the transmittance and wavelength selectivity of metal mesh filter 124 include the thickness of metal mesh filter 124, the ratio of the size of apertures 122 to the thickness of the metal mesh filter 124, the shapes of apertures 122 (especially whether apertures are one-dimensional or two-dimensional), dielectric material used for film 114, and material used for first metal layer 116. Although it is not believed that the positioning of apertures 122 with respect to each other (i.e., the regularity of the aperture pattern and the orientation of the apertures therein) substantially affects the transmittance or wavelength selectivity of metal mesh filter 124, is should be apparent that normal experimentation with aperture orientation may optimize the present invention.

It should also be apparent that the size of apertures 122 may be varied to provide photoconversion of non-visible light. For example, apertures 122 may be provided to filter infrared and near-infrared (light between the infrared and visible spectra) radiation based on the same principle for visible light filtering described above. Other like modifications of the present invention should be readily apparent.

Figure 9:
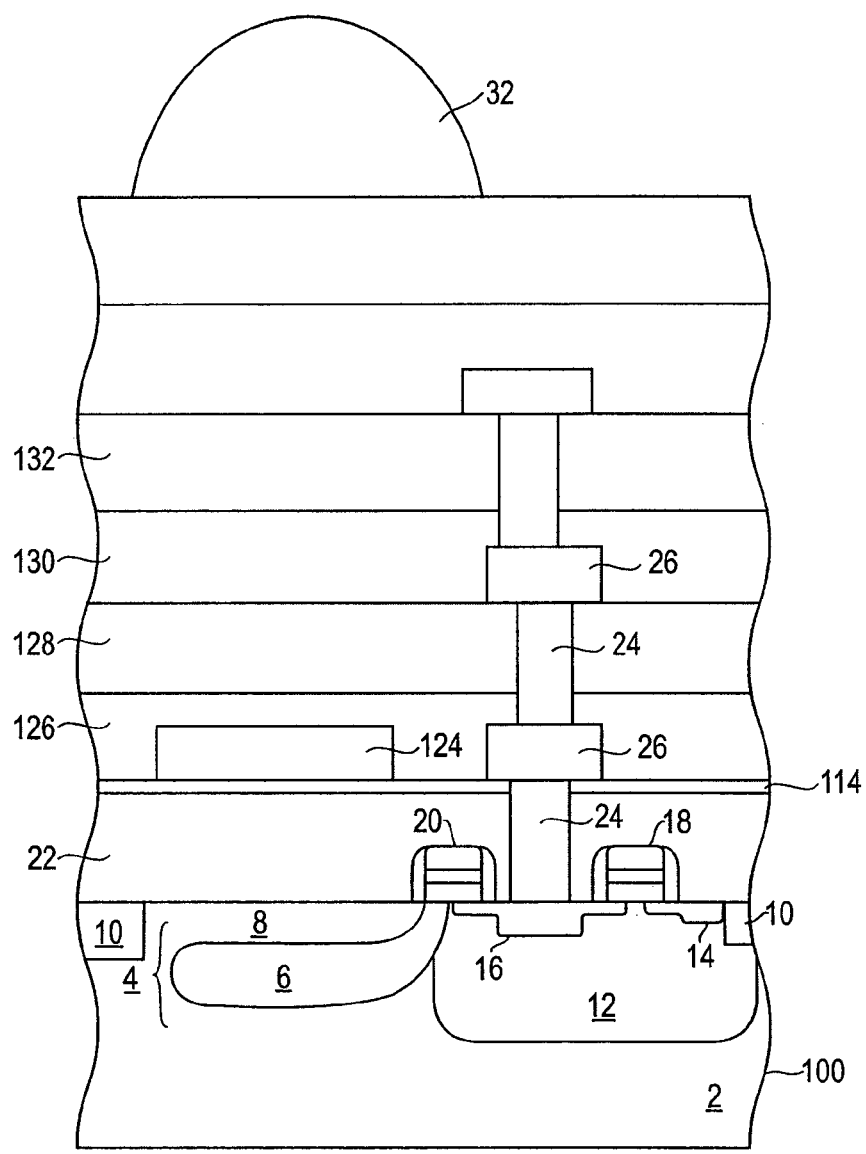
FIG. 9 shows a pixel cell of an exemplary CMOS imager in a state of manufacture subsequent to that shown in FIG. 8, and from an alternate perspective.

Referring now to FIG. 9, pixel 100 is shown after subsequent manufacturing steps. Pixel 100 includes additional passivation layers 126, 128, 130, 132, and further circuitry formed therein, including, for example, plugs 24 and metal conductors 26, formed from successive metal layers. Subsequent passivation and metal layers may be formed according to the present invention, depending on the requirements of a particular application. Finally, microlens 32 is formed over a top passivation layer and substantially over metal mesh filter 124 and photodiode 4.

Figure 10:
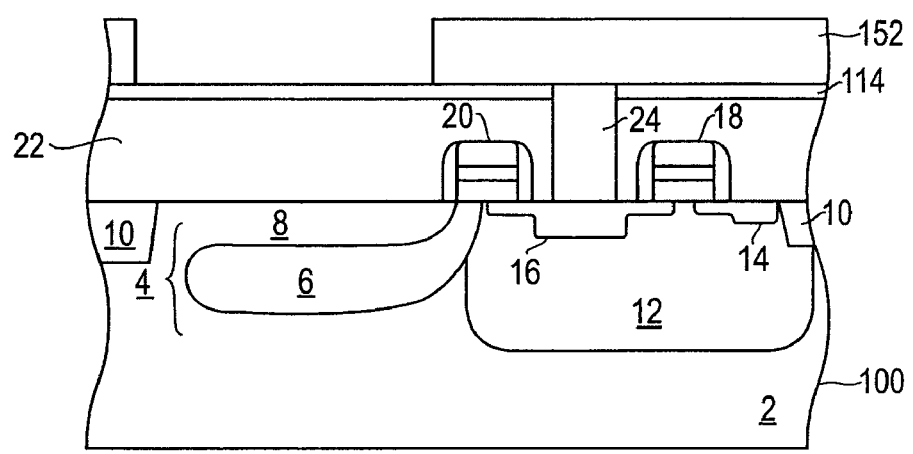
FIG. 10 shows an alternate pixel cell of an exemplary CMOS imager in a first state of manufacture.

In another exemplary embodiment of the invention, a metal mesh filter is formed from a separate metal layer not necessarily used to form imager circuitry. While this embodiment entails an additional metal deposition step, it provides additional flexibility in the placement of the metal mesh filter. Referring to FIG. 10, pixel cell 100 from FIG. 3 is shown with a modified photolithography pattern. Here, photoresist 152 is formed over transparent insulating layer 22 of CMOS pixel cell 100 in such a manner as to leave transparent insulating layer 22 exposed over photodiode 4. The pixel 100 is treated with photolithography to remove transparent insulating layer 22 over photodiode 4, but leaving the layer 22 over the substrate portion 2 surrounding photodiode 4. Photoresist 152 is then removed from pixel 100.

Figure 11:
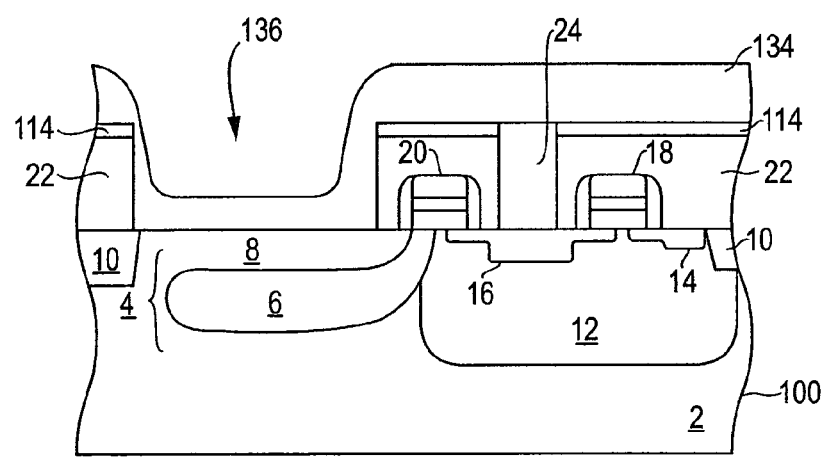
FIG. 11 shows an alternate pixel cell of an exemplary CMOS imager in a state of manufacture subsequent to that shown in FIG. 10.
Figure 12:
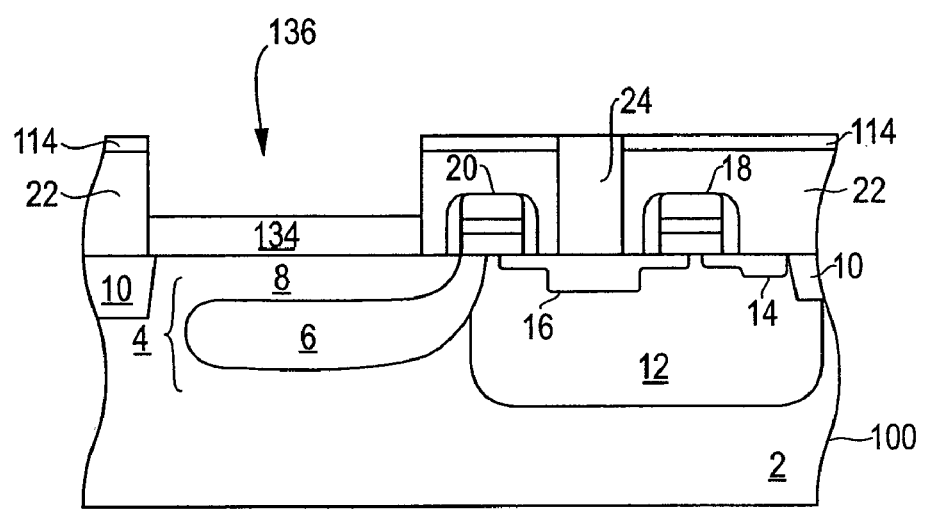
FIG. 12 shows an alternate pixel cell of an exemplary CMOS imager in a state of manufacture subsequent to that shown in FIG. 11.
Figure 13:
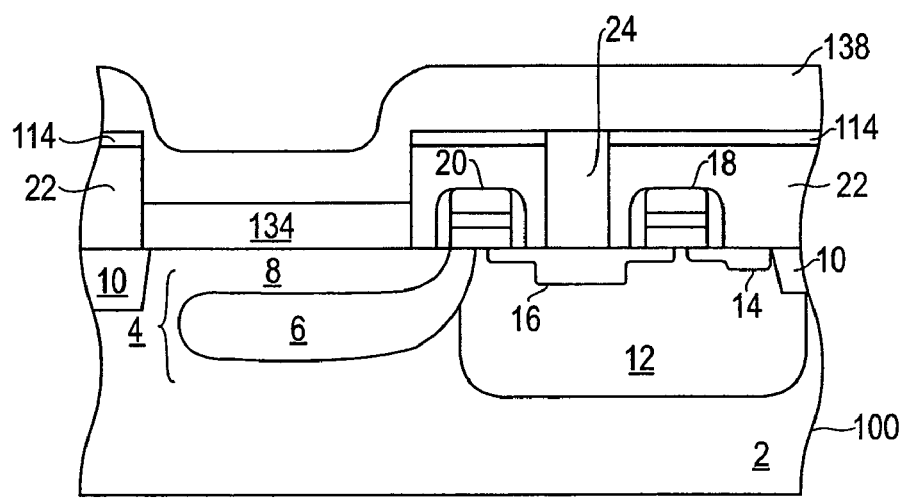
FIG. 13 shows an alternate pixel cell of an exemplary CMOS imager in a state of manufacture subsequent to that shown in FIG. 12.
Figure 14:
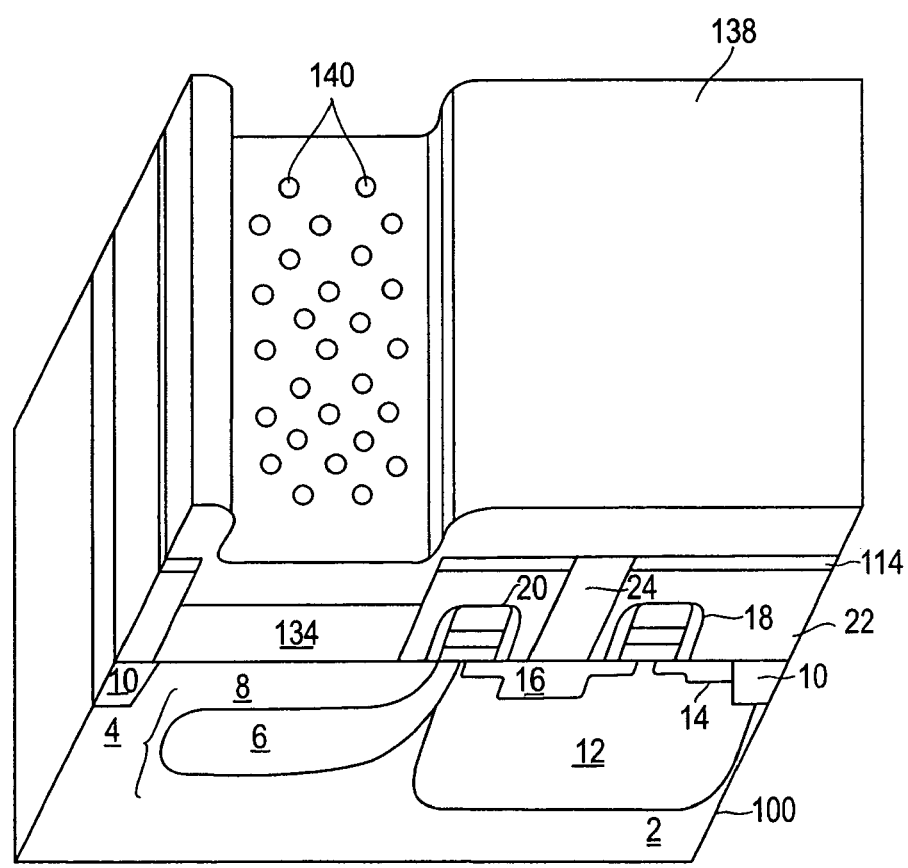
FIG. 14 shows the pixel cell of FIG. 13 from an alternate perspective.
Figure 15:
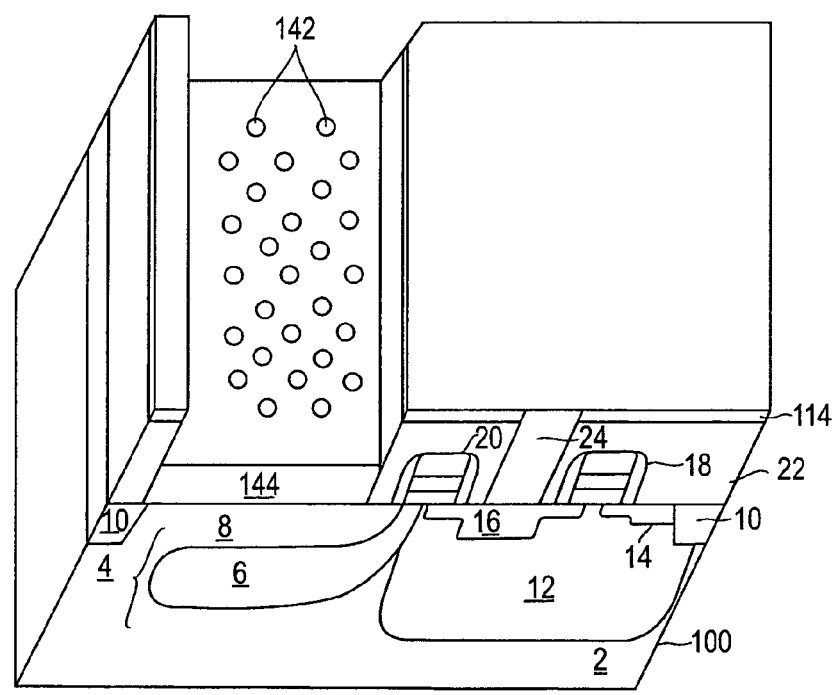
FIG. 15 shows an alternate pixel cell of an exemplary CMOS imager in a state of manufacture subsequent to that shown in FIG. 14.
Figure 16:
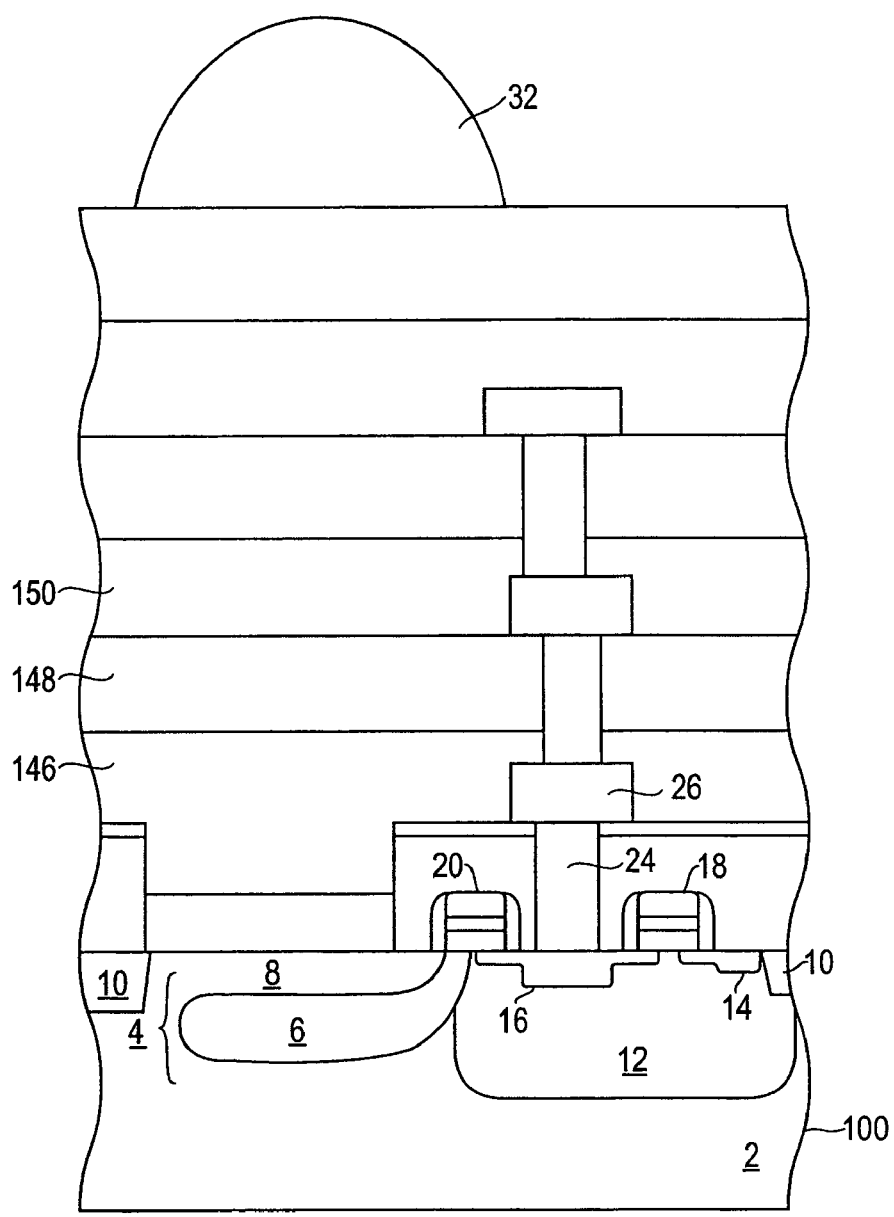
FIG. 16 shows an alternate pixel cell of an exemplary CMOS imager in a state of manufacture subsequent to that shown in FIG. 15, and from an alternate perspective.

FIG. 11 shows CMOS pixel cell 100 with a layer of metal 134 deposited over photodiode 4 in trench 136 and over transparent insulating layer 22 over the remaining portion of pixel cell 100, which was previously treated with photoresist. FIG. 12 shows pixel cell 100 after planarization to remove excess deposited metal 134 from over transparent insulating layer 22, but leaving the metal 134 deposited over photodiode 4 in trench 136. Referring now to FIG. 13, photoresist 138 is formed over remaining deposited metal 134 and remaining transparent insulating layer 22. As shown in FIG. 14, a plurality of apertures 140 is patterned into the portion of photoresist 138 formed over remaining deposited metal 134. When treated with a photolithography step, apertures 142 are formed in remaining deposited metal 134 underneath photoresist apertures 140 to form a metal mesh filter 144, as shown in FIG. 15. FIG. 16 shows complete pixel cell 100 after subsequent manufacturing steps have been performed to provide additional passivation layers 146, 148, 150, plugs 24, conductors 26 and microlens 32. It should be recognized that the illustrated passivation and conductive components 146, 148, 150, and 24, 26, respectively, are not integral to the present invention, and may be designed and manufactured according to the desired application.

Figure 17:
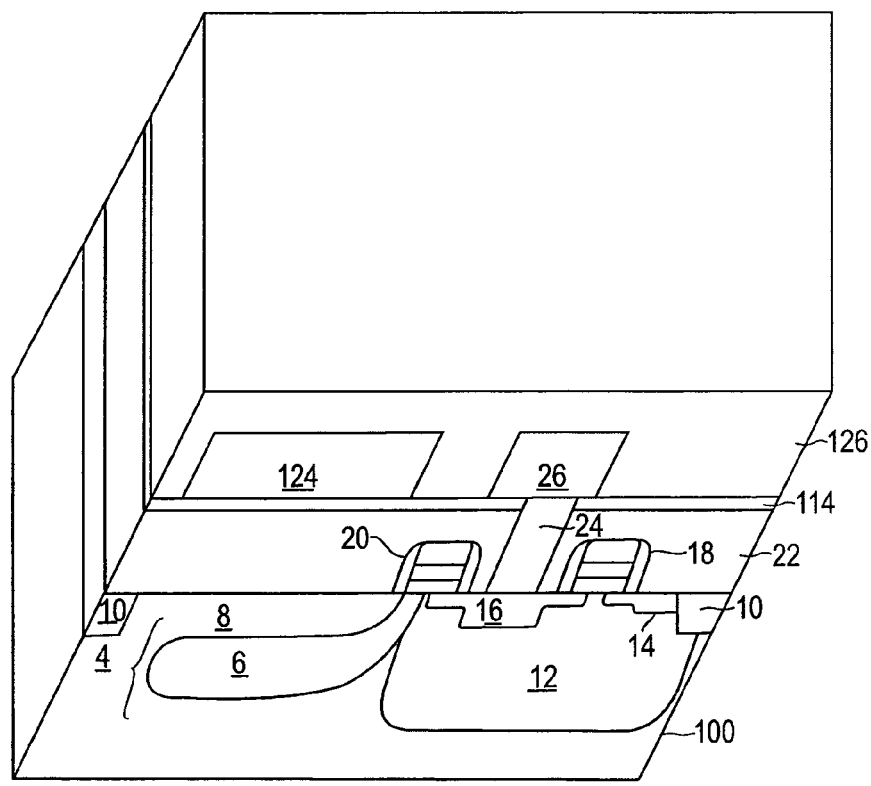
FIG. 17 shows an additional alternate pixel cell of an exemplary CMOS imager in a first state of manufacture.
Figure 18:
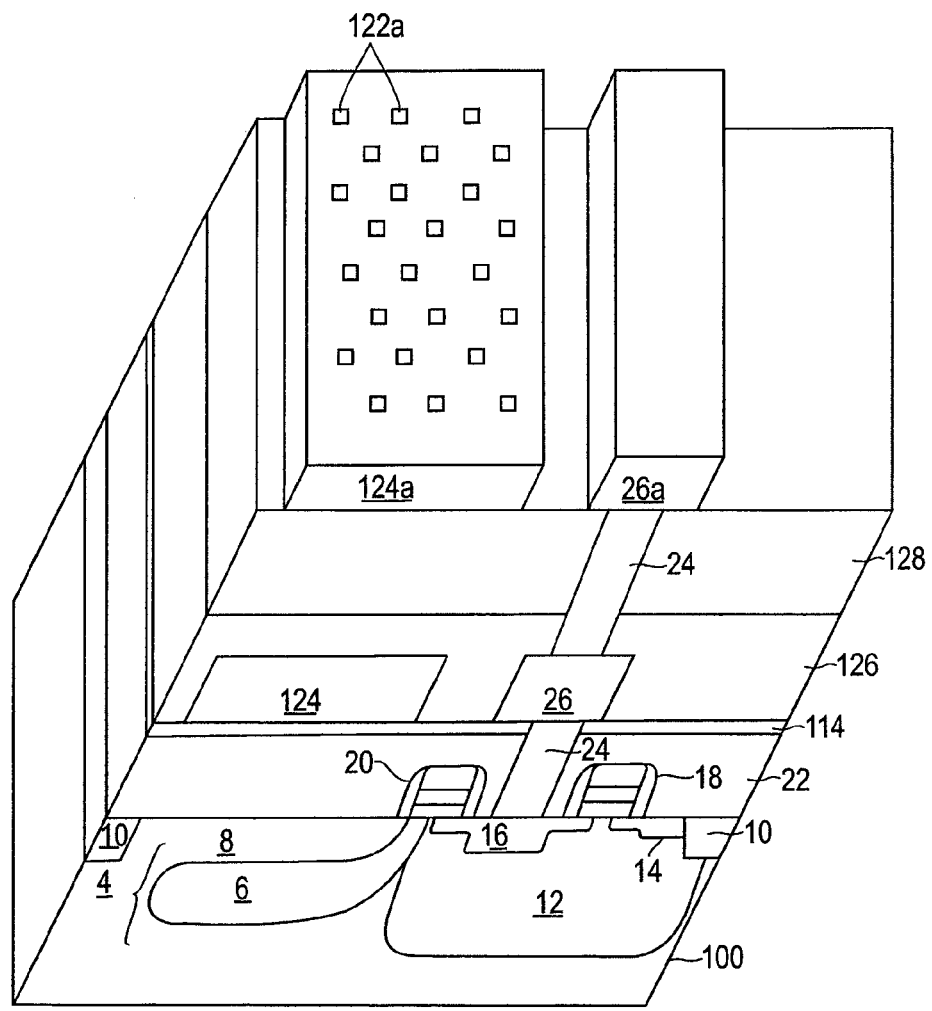
FIG. 18 shows an additional alternate pixel cell of an exemplary CMOS imager in a state of manufacture subsequent to that shown in FIG. 17.
Figure 19:
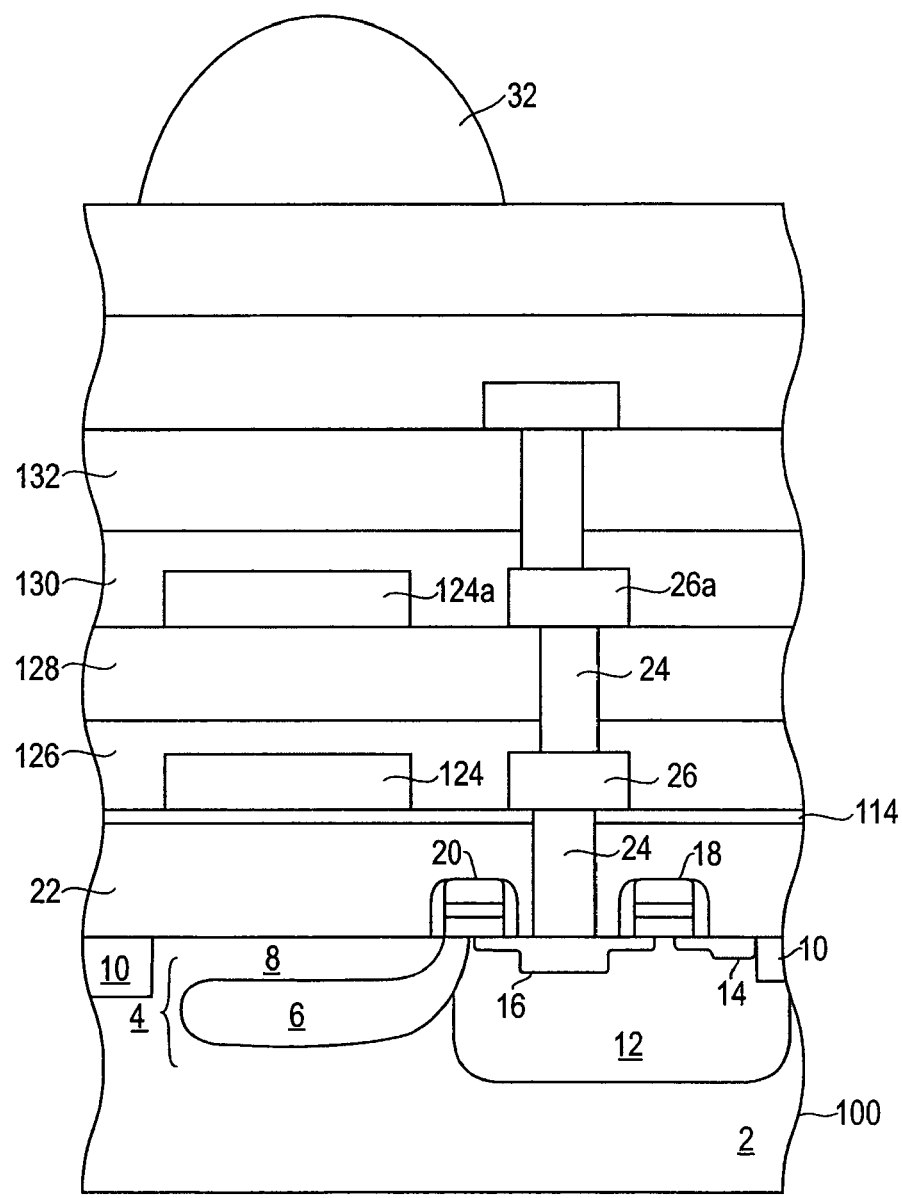
FIG. 19 shows an additional alternate pixel cell of an exemplary CMOS imager in a state of manufacture subsequent to that shown in FIG. 18, and from an alternate perspective.

In another exemplary embodiment of the present invention, multiple mesh filters are formed from multiple metal layers over the same photoconversion device. FIG. 17 shows pixel cell 100 at a state of manufacture subsequent to the pixel cell 100 shown in FIG. 8. In FIG. 17, passivation layer 126 has been deposited over metal mesh filter 124 and conductive feature 26. Referring to FIG. 18, an additional passivation layer 128 is deposited over passivation layer 126, and a plug 24 is formed within passivation layers 126, 128 and in contact with conductive feature 26. Also shown in FIG. 18 are an additional conductive feature 26a and an additional metal mesh filter 124a, both formed from a second metal layer (not shown) deposited over additional passivation layer 128. Additional metal mesh filter 124a is positioned substantially over the first metal mesh filter 124 and, like metal mesh filter 124, includes a pattern of apertures 122a. Forming additional metal mesh filter 124a over metal mesh filter 124 provides further flexibility in tuning pixel cell 100. FIG. 19 shows a two-dimensional profile view of pixel cell 100 including multiple metal mesh filters, after subsequent manufacturing steps and including similar components to pixel cell 100 with a single metal mesh filter shown in FIG. 9.

Figure 20:
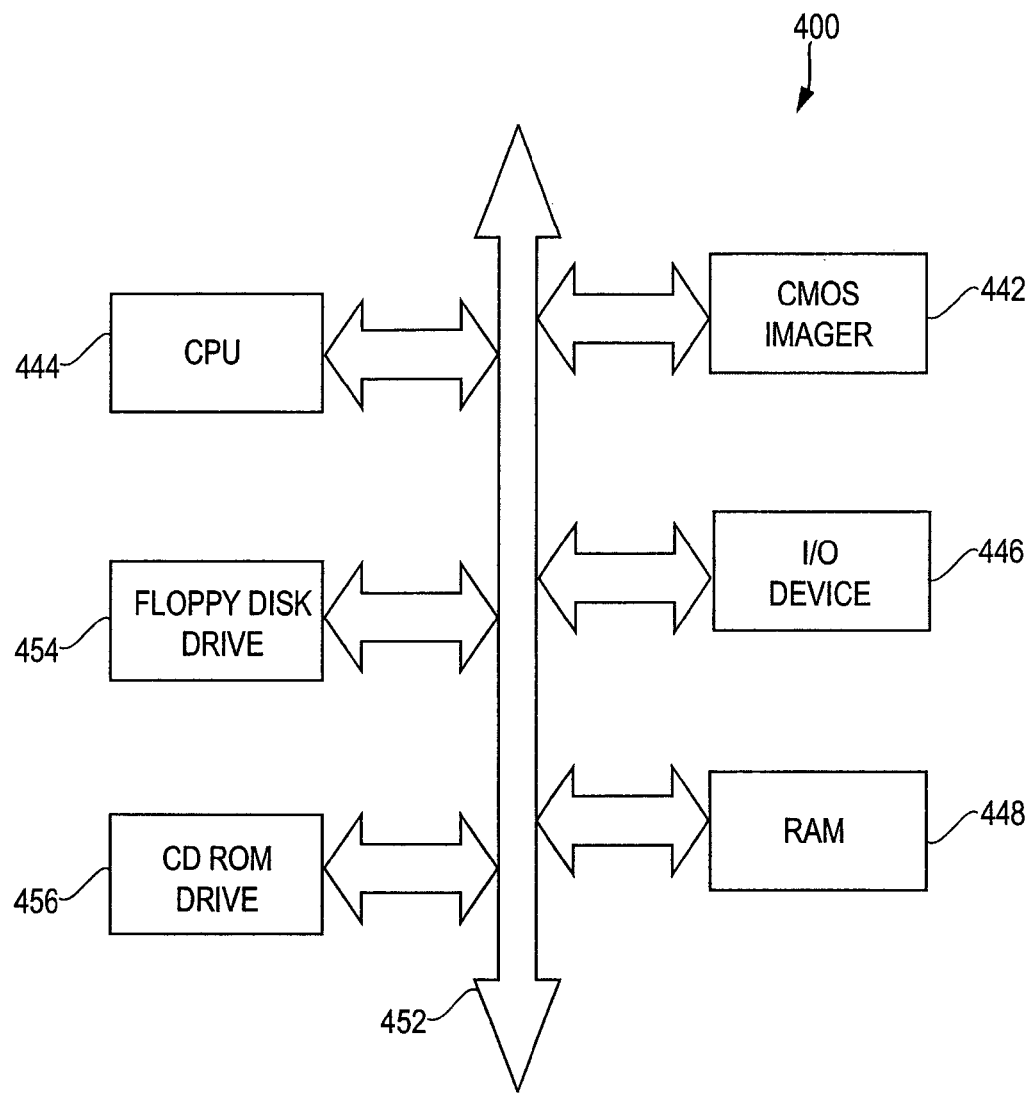
FIG. 20 is an illustration of a computer system having a CMOS imager according to the present invention.

A typical processor based system which includes an imager device 442 having a pixel array in which the pixels are constructed according to the present invention is illustrated generally at 400 in FIG. 20. The imager device 442 produces an output image from signals supplied from the pixel array. A processor based system is exemplary of a system receiving the output of a CMOS imager device. Without being limiting, such a system could include a computer system, camera system, scanner, machine vision system, medical sensor system (such as medical pill sensors), and automotive diagnostic system, all of which can utilize the present invention.

A processor based system 400, such as a computer system, for example generally comprises a central processing unit (CPU) 444, for example, a microprocessor, that communicates with an input/output (I/O) device 446 over a bus 452. The imager device 442 also communicates with the system over bus 452 or other communication link. The computer system 500 also includes random access memory (RAM) 448, and, in the case of a computer system may include peripheral devices such as a floppy disk drive 454 and a compact disk (CD) ROM drive 456 which also communicate with CPU 444 over the bus 452. It may also be desirable to integrate the processor 454, imager device 442 and memory 448 on a single IC chip.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. For example, it should be noted that although the invention has been described with specific reference to a CMOS imager, it also may be used in other imaging apparatuses, including a charge-couple device (CCD) imager. That is, one of the metal mesh filters of the invention may be placed over the photosensitive elements in a CCD imager or other similar imager. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. An image sensor pixel comprising:
   a semiconductor substrate;
   a photoconversion device formed within said semiconductor substrate;
   a dielectric layer formed over said photoconversion device; and
   a mesh optical filter positioned over said dielectric layer and photoconversion device for passing light of a specific color to said photoconversion device.

2. The image sensor pixel of claim 1, wherein said mesh optical filter comprises apertures that are sized to pass light of said specific color to said photoconversion device.

3. The image sensor pixel of claim 1, wherein the image sensor is a CMOS image sensor.

4. The image sensor pixel of claim 1, wherein the image sensor is a CCD image sensor.

5. The image sensor pixel of claim 1, wherein said mesh optical filter is formed from a metal layer deposited and patterned to interconnect image sensor circuitry.

6. The image sensor pixel of claim 5, wherein said metal layer has a thickness of about 70 nm to about 150 nm.

7. The image sensor pixel of claim 5, wherein said metal layer has a thickness of about 100 nm.

8. The image sensor pixel of claim 5, wherein said metal layer is formed of a material comprising at least one of aluminum, silver, copper, and gold.

9. The image sensor pixel of claim 2, wherein said apertures are circular.

10. The image sensor pixel of claim 2, wherein said apertures are rectangular.

11. The image sensor pixel of claim 2, wherein said apertures are triangular.

12. The image sensor pixel of claim 2, wherein said apertures pass visible light to said photoconversion device.

13. The image sensor pixel of claim 2, wherein said apertures have a size of about 400 nm to about 700 nm.

14. The image sensor pixel of claim 13, wherein said apertures have a size of about 475 nm.

15. The image sensor pixel of claim 13, wherein said apertures have a size of about 525 nm.

16. The image sensor pixel of claim 13, wherein said apertures have a size of about 650 nm.

17. The image sensor pixel of claim 2, wherein said apertures pass non-visible light to said photoconversion device.

18. The image sensor pixel of claim 17, wherein said apertures pass infrared light to said photoconversion device.

19. The image sensor pixel of claim 17, wherein said apertures pass near-infrared light to said photoconversion device.

20. The image sensor pixel of claim 1, wherein said mesh optical filter is made of metal.

21. An image sensor pixel comprising:
    a semiconductor substrate;
    a photoconversion device formed within said semiconductor substrate;
    a dielectric layer formed over said photoconversion device;
    a first mesh optical filter positioned over said dielectric layer and photoconversion device for passing light of a specific color to said photoconversion device; and
    at least one additional mesh optical filter positioned over said first mesh optical filter for passing light of a specific color to said photoconversion device.

22. The image sensor pixel of claim 21, wherein each said mesh optical filter comprises a plurality of apertures that are sized to pass light of a specific color.

23. The image sensor pixel of claim 22 wherein each said mesh optical filter is formed from a corresponding metal layer deposited and patterned to interconnect image sensor circuitry.

24. The image sensor pixel of claim 23 wherein each said corresponding metal layer has a thickness of about 70 nm to about 150 nm.

25. The image sensor of claim 23 wherein each said corresponding metal layer is formed of a material comprising at least one of aluminum, silver, copper, and gold.

26. An image sensor comprising:
    an array of pixels, each pixel comprising a photoconversion device and a dielectric layer formed over said photoconversion device; and
    a plurality of metal mesh optical filters respectively formed over said pixels, each metal mesh optical filter passing light of one of three colors to a respective photoconversion device.

27. The image sensor of claim 26, wherein each metal mesh optical filter passes one of red, blue, and green light.

28. The image sensor of claim 26, wherein each metal mesh optical filter passes one of cyan, magenta, and yellow light.

29. The image sensor of claim 26, wherein said metal mesh optical filters are arranged in a Bayer pattern.

30. The image sensor of claim 26, wherein each metal mesh optical filter is formed of a material comprising at least one of aluminum, silver, copper, and gold.

31. The image sensor of claim 26, wherein said metal mesh optical filters are formed from a metal layer deposited and patterned to interconnect imager circuitry.

32. The image sensor of claim 31, wherein said metal layer has a thickness of about 70 nm to about 150 nm.

33. The image sensor of claim 31, wherein said metal layer has a thickness of about 100 nm.

34. The imager sensor of claim 26, wherein each metal mesh optical filter is formed from a metal layer deposited and patterned to provide said metal mesh optical filter.

35. The image sensor of claim 26, wherein the image sensor is a CMOS image sensor.

36. The image sensor of claim 26, wherein the image sensor is a CCD image sensor.

37. The image sensor of claim 26, wherein said metal mesh optical filters comprise apertures which pass light of a specific wavelength to said photoconversion devices.

38. The image sensor of claim 37, wherein said apertures are circular.

39. The image sensor of claim 37, wherein said apertures are rectangular.

40. The image sensor of claim 37, wherein said apertures are triangular.

41. The image sensor of claim 37, wherein said apertures have a size of about 400 nm to about 700 nm.

42. The image sensor of claim 41, wherein said apertures have a size of about 475 nm.

43. The image sensor of claim 41, wherein said apertures have a size of about 525 nm.

44. The image sensor of claim 41, wherein said apertures have a size of about 650 nm.

45. An image sensor system comprising:
an array of pixels, each pixel comprising a photoconversion device and a dielectric layer formed over said photoconversion device; and
a plurality of metal mesh optical filters formed over said pixels, each metal mesh optical filter passing light of one of a plurality of colors to a respective photoconversion device.

46. The image sensor system of claim 45, wherein each metal mesh optical filter passes one of red, blue, and green light.

47. The image sensor system of claim 45, wherein each metal mesh optical filter passes one of cyan, magenta, and yellow light.

48. The image sensor system of claim 45, wherein said metal mesh optical filters are arranged in a Bayer pattern.

49. The image sensor system of claim 45, wherein each metal mesh optical filter is formed of a material comprising at least one of aluminum, silver, copper, and gold.

50. The image sensor system of claim 45, wherein said metal mesh optical filters are formed from a metal layer deposited and patterned to interconnect imager circuitry.

51. The image sensor system of claim 50, wherein said metal layer has a thickness of about 70 nm to about 150 nm.

52. The image sensor system of claim 50, wherein said metal layer has a thickness of about 100 nm.

53. The image sensor system of claim 45, wherein each metal mesh optical filter is formed from a metal layer deposited and patterned to provide said metal mesh optical filter.

54. The image sensor system of claim 45, wherein the image sensor is a CMOS image sensor.

55. The image sensor system of claim 45, wherein the image sensor is a CCD image sensor.

56. The image sensor system of claim 45, wherein said metal mesh optical filters comprise apertures which pass light of a specific wavelength to said photoconversion devices.

57. The image sensor system of claim 56, wherein said apertures are circular.

58. The image sensor system of claim 56, wherein said apertures are rectangular.

59. The image sensor system of claim 56, wherein said apertures are triangular.

60. The image sensor system of claim 56, wherein said apertures have a size of about 400 nm to about 700 nm.

61. The image sensor system of claim 60, wherein said apertures have a size of about 475 nm.

62. The image sensor system of claim 60, wherein said apertures have a size of about 525 nm.

63. The image sensor system of claim 60, wherein said apertures have a size of about 650 nm.

64. A method of forming an image sensor pixel cell comprising the steps of:
forming a photoconversion device within a semiconductor substrate;
forming a dielectric layer over said photoconversion device; and
forming a mesh optical filter over said dielectric layer and photoconversion device for passing light of a specific color to said photoconversion device.

65. The method of claim 64, wherein said mesh optical filter comprises apertures that are sized to pass light of a specific color to said photoconversion device.

66. The method of claim 64 further comprising the step of forming at least one metal layer over said substrate, wherein said mesh optical filter is formed as part of said metal layer.

67. The method of claim 66, wherein said metal layer is formed to a thickness of about 70 nm to about 150 nm.

68. The method of claim 66, wherein said metal layer is formed to a thickness of about 100 nm.

69. The method of claim 64, wherein said metal layer is formed of a material comprising at least one of aluminum, silver, copper, and gold.

70. The method of claim 64, wherein said apertures are circular.

71. The method of claim 64, wherein said apertures are rectangular.

72. The method of claim 64, wherein said apertures are triangular.

73. The method of claim 64, wherein said apertures pass visible light to said photoconversion device.

74. The method of claim 64, wherein said apertures are formed to a size of about 400 nm to about 700 nm.

75. The method of claim 74, wherein said apertures are formed to a size of about 475 nm.

76. The method of claim 74, wherein said apertures are formed to a size of about 525 nm.

77. The method of claim 74, wherein said apertures are formed to a size of about 650 nm.

78. A method of forming an image sensor comprising the steps of:
forming an array of pixels, each pixel comprising a photoconversion device and a dielectric layer formed over said photoconversion device; and
forming a plurality of metal mesh optical filters over said pixels, each metal mesh optical filter passing light of one of three colors to a respective photoconversion device.

79. The method of claim 78, wherein said metal mesh optical filters each pass one of red, blue, and green light.

80. The method of claim 78, wherein said metal mesh optical filters each pass one of cyan, magenta, and yellow light.

81. The method of claim 78, wherein said metal mesh optical filters are arranged in a Bayer pattern.

82. An image sensor pixel comprising:
a semiconductor substrate;
a photoconversion device formed within said semiconductor substrate;
a dielectric layer formed over said photoconversion device; and
an apertured optical filter positioned over said dielectric layer and photoconversion device for passing light of a specific color to said photoconversion device.

83. The image sensor pixel of claim 82, wherein said optical filters comprises a plurality of apertures sized to pass light of a specific color to said photoconversion device.

84. The image sensor pixel of claim 82, wherein said apertured optical filter is formed from a metal layer deposited and patterned to interconnect image sensor circuitry.

85. The image sensor pixel of claim 82, wherein said metal layer has a thickness of about 70 nm to about 150 nm.

86. The image sensor pixel of claim 82, wherein said metal layer has a thickness of about 100 nm.

87. The image sensor pixel of claim 83, wherein said apertures are circular.

88. The image sensor pixel of claim 83, wherein said apertures are rectangular.

89. The image sensor pixel of claim 83, wherein said apertures are triangular.

90. An image sensor pixel comprising:
a semiconductor substrate;
a photoconversion device formed within said semiconductor substrate;
a dielectric layer formed over said photoconversion device;
a first optical filter comprising a plurality of apertures, said first optical filter being positioned over said dielectric layer and photoconversion device for passing light of a first specific color to said photoconversion device; and
at least one additional optical filter comprising a plurality of apertures, said at least one optical filter being positioned over said first optical filter for passing light of a second specific color to said photoconversion device, said first and second colors being different.

91. The image sensor pixel of claim 90 wherein each said first optical filter is formed from a corresponding metal layer deposited and patterned to interconnect image sensor circuitry.

92. The image sensor pixel of claim 91 wherein each said corresponding metal layer has a thickness of about 70 nm to about 150 nm.

93. The image sensor of claim 91 wherein each said corresponding metal layer is formed of a material comprising at least one of aluminum, silver, copper, and gold.

* * * * *